United States Patent
Kodama (10) Patent No.: US 9,472,294 B2
(45) Date of Patent: Oct. 18, 2016

(54) SEMICONDUCTOR STORAGE DEVICE

(71) Applicant: KABUSHIKI KAISHA TOSHIBA, Minato-ku (JP)

(72) Inventor: Takuyo Kodama, Sagamihara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/638,534

(22) Filed: Mar. 4, 2015

(65) Prior Publication Data
US 2016/0071606 A1 Mar. 10, 2016

Related U.S. Application Data

(60) Provisional application No. 62/048,530, filed on Sep. 10, 2014.

(51) Int. Cl.
| | |
|---|---|
| G11C 16/00 | (2006.01) |
| G11C 16/26 | (2006.01) |
| G11C 7/10 | (2006.01) |
| G11C 16/04 | (2006.01) |
| G11C 16/34 | (2006.01) |

(52) U.S. Cl.
CPC .............. *G11C 16/26* (2013.01); *G11C 7/106* (2013.01); *G11C 16/0483* (2013.01); *G11C 16/3459* (2013.01)

(58) Field of Classification Search
CPC ... G11C 16/26; G11C 16/34; G11C 16/3436; G11C 16/3459; G11C 16/0483; G11C 7/106
USPC ............ 365/185.21, 185.22, 185.24, 185.25, 365/203
See application file for complete search history.

(56) References Cited

U.S. PATENT DOCUMENTS

| | | | |
|---|---|---|---|
| 8,203,888 B2 * | 6/2012 | Fukuda | G11C 11/5642 365/185.01 |
| 2010/0135078 A1 * | 6/2010 | Iwai | G11C 11/5642 365/185.03 |

OTHER PUBLICATIONS

Combined Taiwanese Office Action and Search Report issued Mar. 28, 2016 in Patent Application No. 104104799 (with English Translation and English Translation of Categories of Cited Documents).

* cited by examiner

*Primary Examiner* — Tan T Nguyen
(74) *Attorney, Agent, or Firm* — Oblon, McClelland, Maier & Neustadt, L.L.P.

(57) ABSTRACT

A device includes a cell array including cells. A sense node transmits logic of data stored in the cell selected by a WL and a BL. A verify read in a data program sequence includes a first read and a second read. In a time period of shifting from the first read to the second read, a charge state of the sense node is maintained.

15 Claims, 7 Drawing Sheets

FIG. 7

SEMICONDUCTOR STORAGE DEVICE

CROSS REFERENCE TO RELATED APPLICATIONS

This application is based upon and claims the benefit of priority from the prior U.S. Provisional Patent Application No. 62/048,530, filed on Sep. 10, 2014, the entire contents of which are incorporated herein by reference.

FIELD

The embodiments of the present invention relate to a semiconductor storage device.

BACKGROUND

Conventionally, QPW (Quick Pass Write) has been frequently used in a semiconductor storage device such as a NAND flash memory as a data write system. QPW is a system that includes a plurality of write operations and a plurality of verify read operations in one program sequence and repeatedly performs a write operation and a verify read operation, thereby gradually shifting a threshold voltage of a memory cell to a target threshold voltage (hereinafter, "target threshold").

In such QPW, there is a case where a bit line voltage at the time of a write operation is changed according to the threshold voltage of a memory cell (a type program sequence operation). In this case, to detect the threshold voltage of a memory cell, a plurality of read operations need to be performed in each verify read operation.

However, performing a plurality of read operations for each verify read operation lead to an extended program sequence.

DETAILED DESCRIPTION

Embodiments will now be explained with reference to the accompanying drawings. The present invention is not limited to the embodiments.

A semiconductor storage device according to the present embodiment includes a memory cell array comprising a plurality of memory cells. A plurality of word lines are connected to control gates of the memory cells. A bit line is electrically connectable to the memory cells. A sense node transmits logic of data stored in the memory cell selected by the word line and the bit line. A verify read operation in a data program sequence includes a first read operation and a second read operation. In a time period of shifting from the first read operation to the second read operation, a charge state of the sense node is maintained.

First Embodiment

Figure 1:
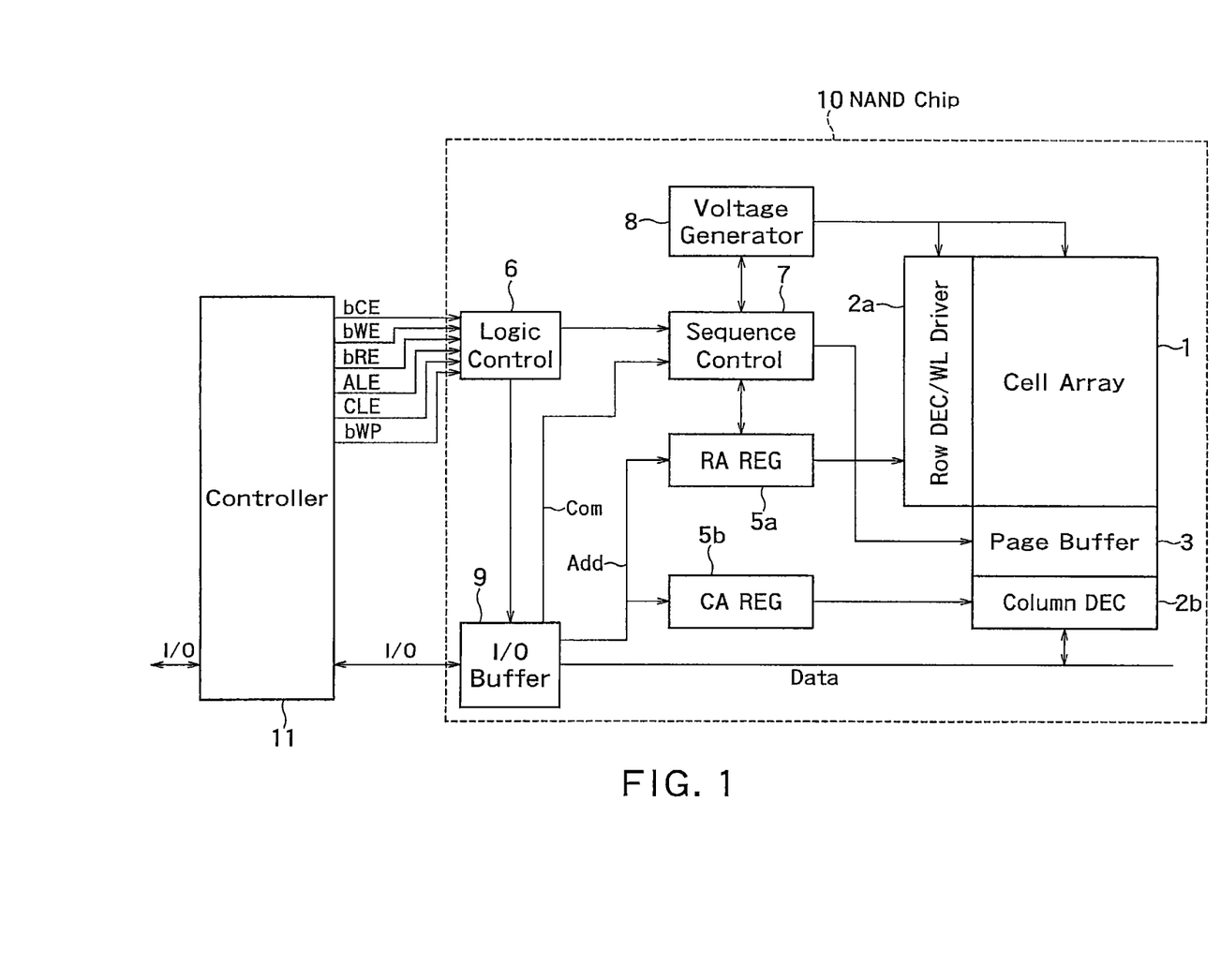
FIG. 1 is a block diagram of a configuration of a NAND flash memory according to a first embodiment.

FIG. 1 is a block diagram of a configuration of a NAND flash memory according to a first embodiment. The NAND flash memory according to the first embodiment includes a NAND chip 10 and a controller 11 that controls the NAND chip 10. A plurality of NAND chips 10 and the controller 11 can be sealed with resin in a package as a multi-chip package (MCP).

A memory cell array 1 that constitutes the NAND chip 10 is constituted by two-dimensionally or three-dimensionally arranging a plurality of floating-gate memory cells MC. A row decoder/word line driver 2a, a column decoder 2b, a page buffer 3, and a high-voltage generation circuit 8 constitute a data write/read circuit that performs data write and data read with respect to the memory cell array 1 in units of pages. The row decoder/word line driver 2a drives word lines and selected gate lines of the memory cell array 1. The page buffer 3 includes a sense amplifier circuit and a data holding circuit for a page, and performs data read and data write with respect to the memory cell array 1 in units of pages.

The column decoder 2b sequentially performs column selection on read data of the page buffer 3 corresponding to one page, and the read data is output via an I/O buffer 9 to an external I/O terminal. Write data supplied from the I/O terminal is selected by the column decoder 2b and loaded in the page buffer 3. Write data corresponding to a page is loaded in the page buffer 3. A row address signal and a column address signal are input via the I/O buffer 9 and transferred to the row decoder 2a and the column decoder 2b, respectively. A row address register 5a holds an erase block address in an erase operation and a page address in a write or read operation. A head column address used for loading write data before a write operation starts and a head column address for a read operation are input to a column address register 5b. The column address register 5b holds input column addresses until a write enable signal bWE or a read enable signal bRE is toggled in predetermined conditions.

A logic control circuit 6 controls command input or address input and data input and output based on a control signal such as a chip enable signal bCE, a command enable signal CLE, an address latch enable signal ALE, the write enable signal bWE, and the read enable signal bRE. A read operation or a write operation is performed by a command. When receiving a command, a sequence control circuit 7 executes read, write, or erase sequence control. The high-voltage generation circuit 8 is controlled by the control circuit 7 to generate predetermined voltages required for various operations.

The controller 11 executes data write control and data read control in conditions suitable for the current write state of the NAND chip 10. A part of the data read control can be executed in the NAND chip 10.

Figure 2:
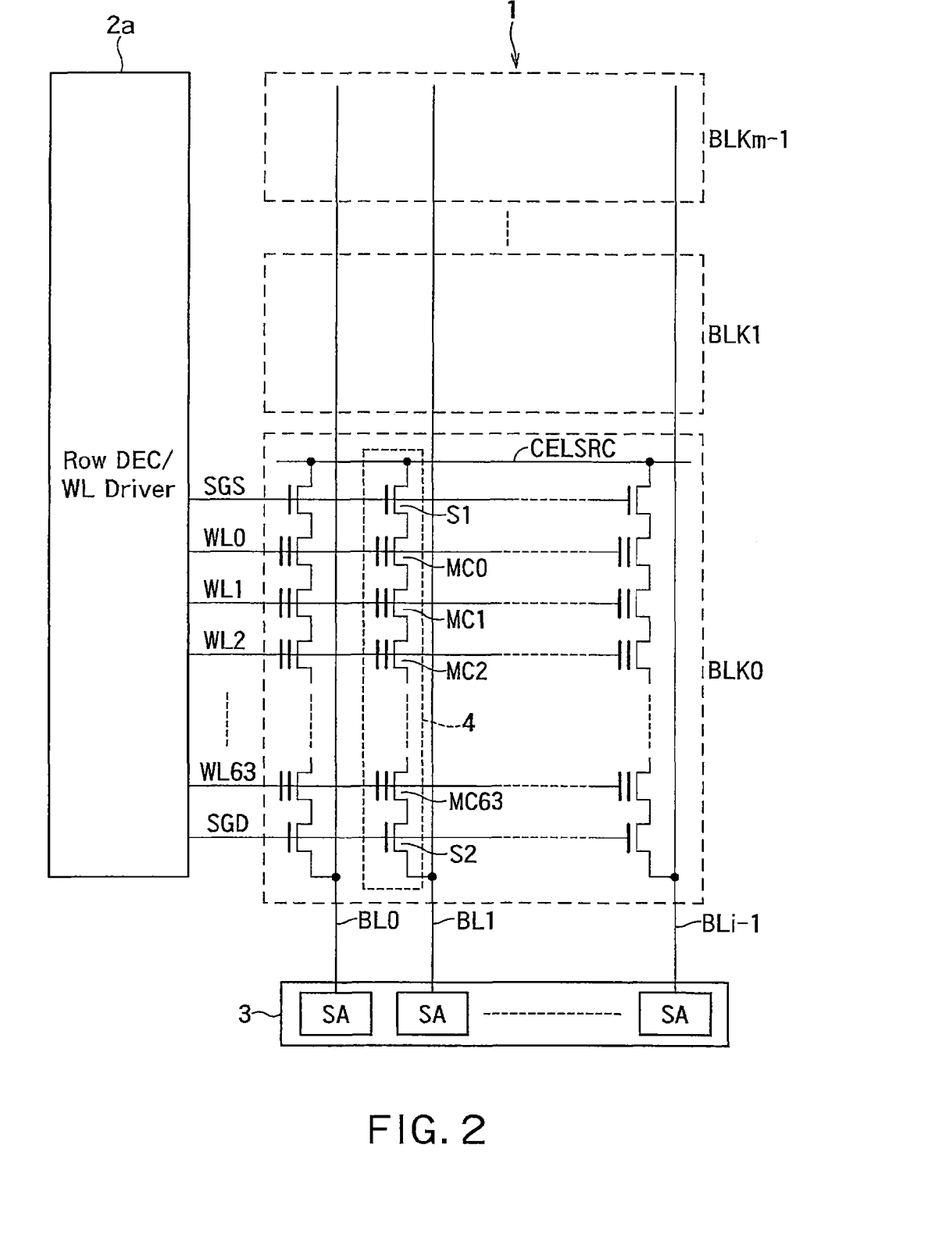
FIG. 2 shows a specific configuration of the cell array 1.

FIG. 2 shows a specific configuration of the cell array 1. In this example, a NAND cell unit (a NAND string) 4 is constituted by 64 memory cells MC0 to MC63 serially connected to each other and select gate transistors S1 and S2 connected to ends of a block of the memory cells MC0 to MC63. A source of the select gate transistor S1 is connected to a common source line CELSRC, and a drain of the select gate transistor S2 is connected to a bit line BL (BL0 to BLi−1). The bit line BL can be electrically connected via the select gate transistor S2 to memory cells MC within the NAND cell unit 4. Control gates of the memory cells MC0 to MC63 are respectively connected to word lines WL (WL0 to WL63), and gates of the select gate transistors S1 and S2 are connected to select gate lines SGS and SGD, respectively.

The range of a plurality of memory cells along one word line is a page that is the unit of batch data read or batch data write. A plurality of NAND cell units arranged in a direction of word lines constitute a cell block BLK that is the unit of data batch erasure. In FIG. 2, the cell array 1 is constituted by arranging a plurality of cell blocks BLK0 to BLKm−1 sharing bit lines BL in the direction of the bit lines BL. The word lines WL and the select gate lines SGS and SGD are driven by the row decoder 2a. Each bit line BL is connected to a sense amplifier circuit SA in the page buffer 3.

Figure 3:
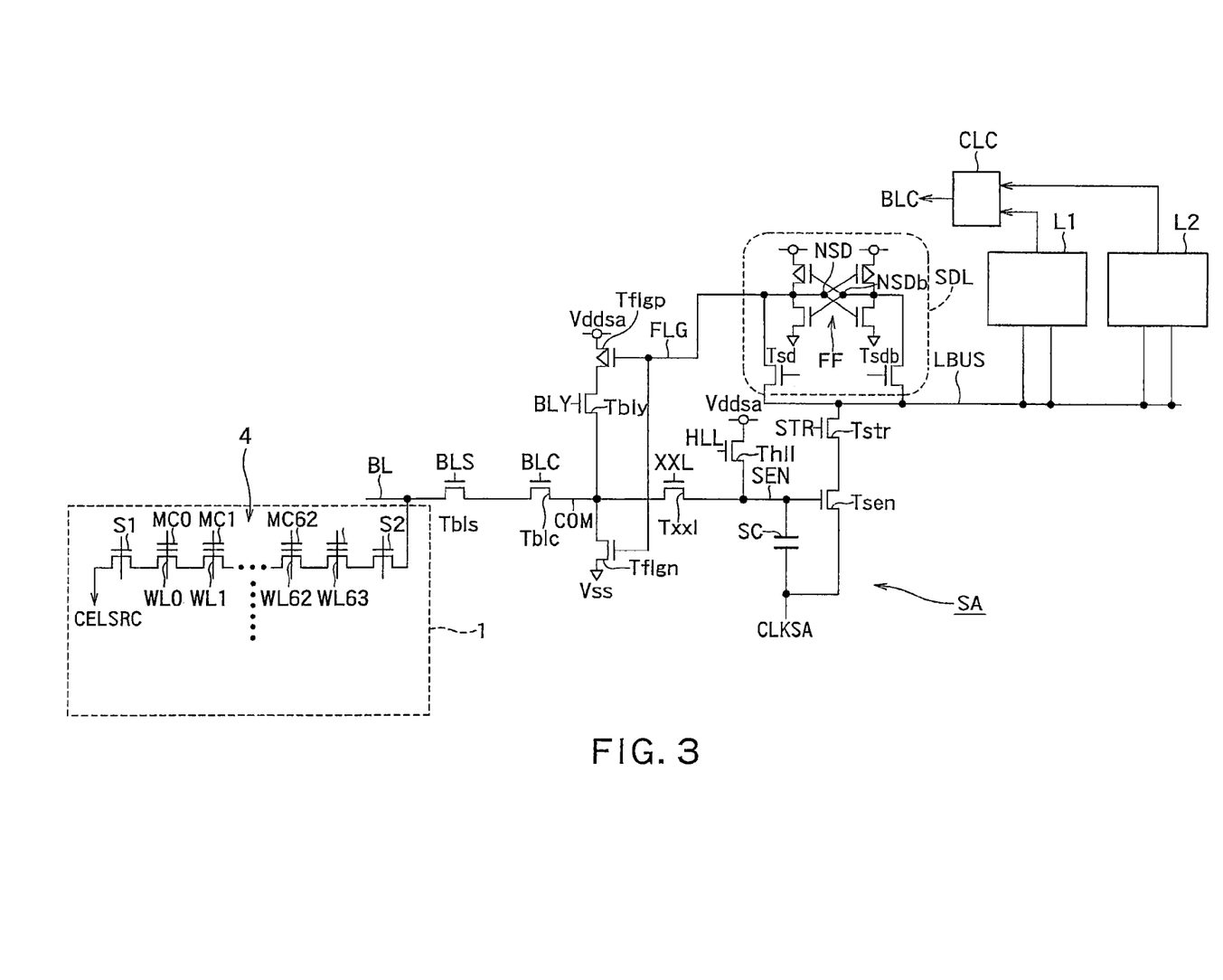
FIG. 3 shows an example of a configuration of a sense amplifier circuit SA.

FIG. 3 shows an example of a configuration of the sense amplifier circuit SA. The configurations of the memory cell array 1 and the NAND cell unit 4 are identical to those explained with reference to FIG. 2.

The sense amplifier circuit SA is provided for each of the bit lines BL, and detects logic of data stored in a memory cell selected by the word line WL and the bit line BL. FIG. 3 shows one bit line BL and one sense amplifier circuit SA for convenience. A voltage of the cell source CELSRC is a source voltage of a memory cell MC and higher than a low-level voltage Vss used for the sense amplifier circuit SA.

The sense amplifier circuit SA includes an N-type switching transistor Tbls, an N-type clamp transistor Tblc, an N-type switching transistor Txxl, an N-type sense transistor Tsen, an N-type precharge transistor Thll, an N-type switching transistor Tbly, an N-type flag transistor Tflgn, a P-type flag transistor Tflgp, an N-type strobe transistor Tstr, an SD latch circuit SDL, a first latch circuit L1, a second latch circuit L2, a sense capacitor SC, a sense node SEN, and a bus LBUS.

The switching transistor Tbls is connected between the bit line BL and the clamp transistor Tblc and provided to electrically connect the bit line BL to the sense amplifier circuit SA.

The clamp transistor Tblc is connected between the switching transistor Tbls and a node COM (between the bit line BL and the sense node SEN) and provided to determine a voltage to be applied to the bit line BL. A gate of the clamp transistor Tblc is connected to a clamp logic circuit CLC and controlled by a signal BLC. As explained later, the signal BLC is changed by data latched in the first and second latch circuits L1 and L2. The conductive state of the clamp transistor Tblc is thus changed by the data latched in the first and second latch circuits L1 and L2.

The switching transistor Txxl is connected between the node COM and the sense node SEN and provided to electrically connect the sense node SEN to the bit line BL and a selected memory cell.

A gate of the sense transistor Tsen is connected to the sense node SEN. A drain of the sense transistor Tsen is connected via the strobe transistor Tstr to the bus LBUS and further connected via the bus LBUS to the first and second latch circuits L1 and L2. A source of the sense transistor Tsen is connected to a signal line CLKSA. The sense transistor Tsen becomes a conductive state according to a voltage of the sense node SEN and passes a current according to this conductive state between the bus LBUS and the signal line CLKSA. The sense node SEN transmits logic of data stored in a memory cell MC selected by a word line WL and a bit line BL, and thus the sense transistor Tsen transmits the logic of the data stored in the selected memory cell MC to the bus LBUS.

The strobe transistor Tstr is connected between the bus LBUS and the sense transistor Tsen, and becomes an on-state when a current flows between the bus LBUS and the signal line CLKSA.

The sense capacitor SC is capacitively connected between the sense node SEN and the signal line CLKSA and provided to transmit a voltage between the sense capacitor SC and the signal line CLKSA to the sense node SEN.

The precharge transistor Thll is connected between the sense node SEN and a power supply voltage Vddsa and provided to precharge the sense node SEN. In the first embodiment, the select gate transistor S1 on the side of a source of the NAND cell unit 4 is connected to the cell source CELSRC having a voltage higher than the Vss, and thus the precharge transistor Thll is constituted by an N-type transistor. The reason why the precharge transistor Thll is constituted by an N-type transistor is explained later in a second embodiment.

The switching transistor Tbly is connected between the flag transistor Tflgp and the node COM and provided to connect the power supply voltage Vddsa to the node COM.

The flag transistors Tflgn and Tflgp connect one of the power supply voltage Vddsa and the low-level voltage Vss to the node COM based on write data latched in the SD latch circuit SDL. For example, when the SD latch circuit SDL outputs logical high to a flag node FLG, the flag transistor Tflgn becomes an on-state and the flag transistor Tflgp becomes an off-state. The low-level voltage Vss is thus connected to the node COM and transmitted via the transistors Tblc and Tbls to the bit line BL. On the other hand, when the SD latch circuit SDL outputs logical low to the flag node FLG, the flag transistor Tflgp becomes an on-state and the flag transistor Tflgn becomes an off-state. The high-level power supply voltage Vddsa is thus connected to the node COM and transmitted via the transistors Tblc and Tbls to the bit line BL. The power supply voltage Vddsa is a supply voltage for the sense amplifier circuit SA generated by the high-voltage generation circuit 8.

The SD latch circuit SDL is connected between the bus LBUS and the flag node FLG. The SD latch circuit SDL includes a flip flop FF that latches complementary data in nodes NSD and NSDb, and a transistor Tsd connected between the node NSD and the bus Lbus and a transistor Tsdb connected between the node NSDb and the bus LBUS. The SD latch circuit SDL latches data according to latch data in the first and second latch circuits L1 and L2 via the bus LBUS and outputs the data to the flag node FLG in a write operation. The SD latch circuit SDL operates the flag transistors Tflgn and Tflgp to determine the voltage of the node COM at the time of data write. In verify read, the SD latch circuit SDL holds the node NSD at logical low and fixes the flag node FLG at logical low.

The first latch circuit L1 is connected to the bus LBUS, and latches logic that is transmitted to the sense node SEN in a first verify read operation of a plurality of verify read operations after a first write operation.

The second latch circuit L2 is connected to the bus LBUS, and latches logic that is transmitted to the sense node SEN in a second verify read operation of the verify read operations after the first write operation. Internal configurations of the latch circuits L1 and L2 can be the same as that of the SD latch circuit SDL.

Data latched in the first and second latch circuits L1 and L2 is applied via the clamp logic circuit CLC to a gate of the clamp transistor Tblc. The clamp logic circuit CLC operates the clamp transistor Tblc at a gate voltage (BLC) according to detection results of a plurality of verify read operations (threshold voltages of the selected memory cells MC). As a result, a voltage of the bit line BL is clamped at a voltage according to a conductive state of the clamp transistor Tblc, and a voltage of the bit line BL in a write operation can be changed depending on the threshold voltage of a selected memory cell MC.

Figure 4:
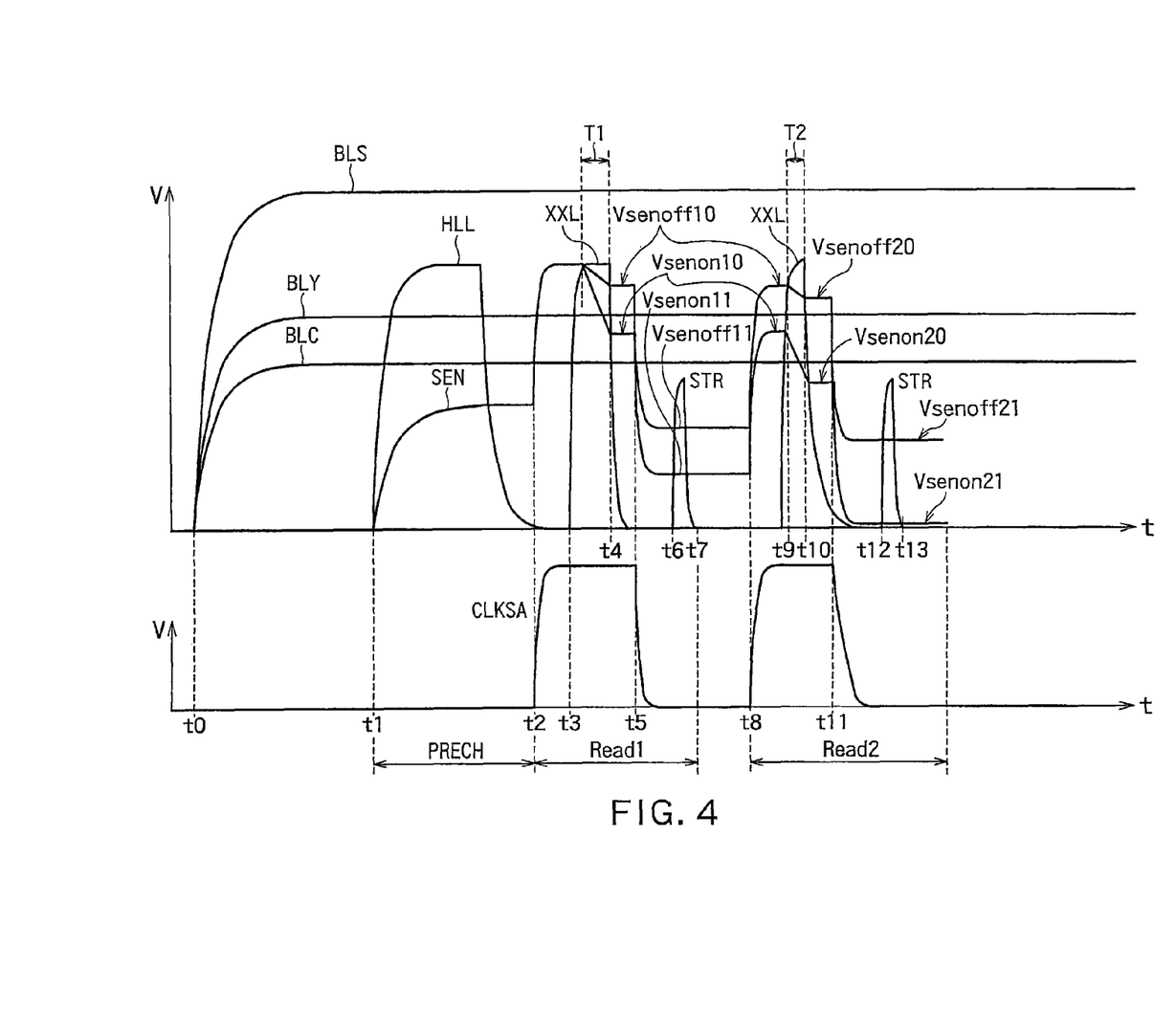
FIG. 4 is a timing chart of an example of a verify read operation of a memory according to the first embodiment.

FIG. 4 is a timing chart of an example of a verify read operation of a memory according to the first embodiment. The memory according to the first embodiment writes data (data of one page) in a plurality of memory cells MC (the selected memory cells MC) connected to a selected word line WL by a QPW system. As explained above, a QPW program sequence includes a plurality of write operations and a plurality of verify read operations, and is executed by repeating the write operation and the verify read operation. In an initial write operation, it is assumed that the voltage of a bit line BL is the low-level voltage Vss and the voltage of a word line WL is a program voltage (>Vss), and a threshold voltage of a selected memory cell is gradually shifted to a target threshold by a voltage difference between the bit line BL and the word line WL.

When the threshold voltage of the selected memory cell MC becomes closer to the target threshold, the voltage of the bit line BL at the time of a write operation is changed by a voltage of the signal BLC described above and the voltage of the bit line BL is increased from the Vss. The voltage difference between the bit line BL and the word line WL thus becomes moderate and the shift of the threshold voltage of the selected memory cell MC due to a write operation becomes small.

When the threshold voltage is shifted to the target threshold, write is completed. With respect to a selected memory cell MC in which write has been completed, the voltage of the bit line BL is set to be equal to the voltage of the word line WL in the next write operation so that the voltage difference is not applied to this memory cell MC. Accordingly, in subsequent write operations, the threshold voltage of the selected memory cell MC in which write has been completed is not shifted. On the other hand, with respect to a selected memory cell MC in which write has not been completed, the voltage difference is applied to this memory cell MC also in the next write operation and a write operation is performed thereon. When write is completed in all selected memory cells MC, write of the corresponding page is completed.

As explained above, in QPW, when the threshold voltage of the selected memory cell MC becomes closer to the target threshold, the voltage difference between the bit line BL and the word line WL becomes moderate and the threshold voltage of the selected memory cell MC is further shifted a little. Further, the threshold voltage of the selected memory cell MC in which write is completed in the middle of a program sequence is not shifted thereafter. Accordingly, after write of one page is completed, a distribution of thresholds of all the selected memory cells can be concentrated in a narrow range. That is, with QPW, variation in threshold voltages of the selected memory cells MC can be reduced. At this time, a read operation that determines that the threshold voltage of the selected memory cell MC has reached the target threshold and a read operation that determines that the threshold voltage of the selected memory cell MC becomes closer to the target threshold are necessary. That is, a verify operation on each target threshold after a write operation requires at least two read operations (a type program sequence operation).

FIG. 4 shows an example of a verify read operation including two read operations Read1 and Read2. The vertical axis represents the voltage of each signal and the horizontal axis represents time. Gate signals of the transistors (BLS, BLC, BLY, XXL, HLL, and STR) are controlled by the sequence controller 7, the page buffer 3, or the sense amplifier circuit SA.

(Precharge)

After a certain write operation in a program sequence operation is performed, each sense amplifier circuit SA performs two read operations Read1 and Read2 as a verify read operation. At this time, at t0, the signals BLS, BLY and BLC rise and the transistors Tbls, Tbly; and Tblc become an on-state.

The signal BLS rises to a voltage higher than those of the signals BLY and BLC, and the switching transistor Tbls connects the bit line BL to the clamp transistor Tblc at a low resistance.

The signal BLY rises to a voltage higher than that of the signal BLC, and the switching transistor Tbly determines the voltage of the node COM. Assuming that the threshold voltage of the switching transistor Tbly is Vtbly, the voltage of the node COM is a voltage (Vbly-Vtbly) obtained by subtracting Vtbly from a voltage of the signal BLY (a gate voltage of the transistor Tbly).

The signal BLC has a voltage lower than those of the signals BLS and BLY, and the clamp transistor Tblc becomes an on-state by the signal BLC. The voltage of the bit line BL is changed depending on the conductive state of the clamp transistor Tblc. That is, the clamp transistor Tblc adjusts the conductive state between the node COM and the bit line BL, thereby controlling the voltage of the bit line BL.

In the verify read operation, the flag node FLG is maintained at logical low, and the P-type flag transistor Tflgp becomes an on-state and the N-type flag transistor Tflgn becomes an off-state. Accordingly, a current from the power supply voltage Vddsa flows via the node COM in the bit line BL and a selected memory cell MC. At this time, a cell current according to a threshold voltage Vtc of the selected memory cell MC flows. In a read operation, a positive voltage is applied to a non-selected word line WL and a voltage is not applied to a selected word line WL. For example, when an added voltage of a voltage of the cell source CELSRC and the threshold voltage Vtc is lower than a voltage of the selected word line WL, a cell current flows, and thus the voltage of the node COM is lower than the voltage (Vbly-Vtbly). On the other hand, when the added voltage of the voltage of the cell source CELSRC and the threshold voltage Vtc is higher than the voltage of the selected word line WL, a cell current does not flow, and thus the voltage of the node COM is maintained at the voltage (Vbly-Vtbly). As explained above, the voltage of the node COM is a voltage according to the threshold voltage of the memory cell MC.

Next, at t3, a voltage of a signal HLL rises to cause the precharge transistor Thll to be in an on-state. The sense node SEN is thus precharged.

(First Read Operation Read1)

After precharge is completed, at t2, the voltage of a signal CLKSA rises. At this time, the sense node SEN is in a floating state and thus a voltage level of the sense node SEN is increased by as much as an increase amount in the voltage of the signal CLKSA. This is because the voltage of the sense node SEN is increased to be higher than the voltage of the cell source CELSRC, thereby enabling discharge from the sense node SEN to a selected memory cell MC.

Next, at t3, the signal XXL rises to cause the switching transistor Txxl to be in an on-state. At this time, for example, when an added voltage of the voltage of the cell source CELSRC and the threshold voltage Vtc is lower than a voltage of a selected word line WL, the selected memory cell MC becomes an on-state and a cell current flows. Therefore, the sense node SEN is discharged via the bit line BL and the selected memory cell MC. The voltage of the sense node SEN thus decreases as time elapses. On the other hand, when the added voltage of the voltage of the cell source CELSRC and the threshold voltage Vtc is higher than the voltage of the selected word line WL, the selected memory cell MC becomes an off-state and a cell current does not flow much. Therefore, the discharge of the sense node SEN substantially ends by charging of the node COM. Therefore, the voltage of the sense node SEN does not decrease much as time elapses. As explained above, the voltage of the sense node SEN is a voltage according to the threshold voltage of the memory cell MC.

After a first time period T1 elapses since the signal XXL rises, at t4, the signal XXL falls. That is, in the first read operation Read1, discharge from the sense node SEN to the bit line BL and the selected memory cell MC is performed during the first time period T1, and then the switching transistor Txxl becomes an off-state. The sense node SEN becomes a floating state again, and thus the charge of the sense node SEN is held. At this time, the voltage of the sense node SEN is Vsenon10 or Vsenoff10. Vsenon10 is a voltage of the sense node SEN when the selected memory cell MC is in an on-state in a time period t4 to t5. Vsenoff10 is a voltage of the sense node SEN when the selected memory cell MC is in an off-state in the time period t4 to t5.

Next, at t5, while the charge of the sense node SEN is held, the voltage of the signal CLKSA is reduced to be returned to the original voltage level. Accordingly, the voltage of the sense node SEN decreases while the charge state of the sense node SEN is held. That is, as shown in FIG. 4, the voltage of the sense node SEN decreases from Vsenon10 to Vsenon11 or from Vsenoff10 to Vsenoff11. At this time, the charge state of the sense node SEN is held, and thus a voltage difference between Vsenon10 and Vsenoff10 is substantially equal to a voltage difference between Vsenon11 and Vsenoff11. That is, the voltage of the sense node SEN decreases by as much as a decrease amount in the voltage of the signal CLKSA, while the voltage difference between Vsenon10 and Vsenoff10 is held.

The voltage of the sense node SEN controls the conductive state of the sense transistor Tsen. Accordingly, when the voltage of the sense node SEN is lower than a threshold voltage (Vtsen) of the sense transistor Tsen, the sense transistor Tsen becomes an off-state. When the voltage of the sense node SEN is higher than the threshold voltage Vtsen, the sense transistor Tsen becomes an on-state.

Next, in a time period t6 to t7, a signal STR rises in a pulse shape to cause the strobe transistor Tstr to be in an on-state for a short time. When the strobe transistor Tstr becomes an on-state, the bus LBUS precharged in advance is connected to the sense transistor Tsen. Accordingly, when the sense transistor Tsen is an off-state, the bus LBUS is not discharged and the voltage of the bus LBUS is maintained at a high level. On the other hand, when the sense transistor Tsen is an on-state, the bus LBUS is discharged and the voltage of the bus LBUS is reduced to a low level.

The voltage level of the bus LBUS at this time is latched by the first latch circuit L1. For example, it is assumed that the threshold voltage Vtsen is between Vsenon11 and Vsenoff11. When the voltage of the sense node SEN is Vsenon11, the sense transistor Tsen is in an off-state and thus the voltage of the bus LBUS does not decrease much. Accordingly, in this case, the first latch circuit L1 latches logical high. On the other hand, when the voltage of the sense node SEN is Vsenoff11, the sense transistor Tsen is in an on-state and thus the voltage of the bus LBUS decreases. Accordingly, in this case, the first latch circuit L1 latches logical low. As explained above, the first latch circuit L1 can latch a voltage state (a logic state) of the sense node SEN in the first read operation Read1.

In QPW, as write proceeds, the threshold voltage of a selected memory cell MC increases. Accordingly, when the voltage of the sense node SEN is low (for example, Vsenon11), it means that write has not proceeded much. On the other hand, when the voltage of the sense node SEN is high (for example, Vsenoff11), it means that write has proceeded much or write has been completed.

(Second Read Operation Read2)

After the first read operation Read1, the memory according to the first embodiment successively performs the second read operation Read2.

In the first embodiment, the signal HLL does not rise between the first read operation Read1 and the second read operation Read2 and a precharge operation of the sense node SEN is not performed. That is, in a time period t7 to t8 of shifting from the first read operation Read1 to the second read operation Read2, the charge state of the sense node SEN is maintained. Accordingly, when the signal CLKSA rises at t8, similarly to the case at t2, the voltage of the sense node SEN is increased from Vsenon11 to Vsenon10 or from Vsenoff11 to Vsenoff10. That is, in a time period t8 to t9, the voltage of the sense node SEN is increased to a level equal to that of the sense node SEN in the time period t4 to t5 in the first read operation Read1.

Next, at t9, the signal XXL rises to cause the switching transistor Txxl to be in an on-state. At this time, for example, when the added voltage of the voltage of the cell source power supply CELSRC and the threshold voltage Vtc is lower than a voltage of a selected word line WL, a selected memory cell MC is in an on-state and thus a cell current flows again. Therefore, the sense node SEN is discharged again via the bit line BL and the selected memory cell MC. The voltage of the sense node SEN thus further decreases from the voltage Vsenon10 of the sense node SEN in the time period t4 or t5 as time elapses. On the other hand, when the added voltage of the cell source power supply CELSRC and the threshold voltage Vtc is higher than the voltage of the selected word line WL, the selected memory cell MC is an off-state and thus a cell current does not flow much. Therefore, discharge of the sense node SEN substantially ends by charging of the node COM. Therefore, the voltage of the sense node SEN does not decrease much from the voltage Vsenoff10 of the sense node SEN in the time period t4 or t5 even when time elapses. As explained above, the voltage of the sense node SEN is a voltage that is further reduced according to the threshold voltage of the memory cell MC.

After the second time period T2 elapses since the signal XXL rises, at t10, the signal XXL falls. That is, in the second read operation Read2, discharge from the sense node SEN to the bit line BL and the selected memory cell MC is performed during the second time period T2, and then the switching transistor Txxl becomes an off-state. Accordingly, the sense node SEN becomes a floating state again, and thus the charge of the sense node SEN is held. At this time, the voltage of the sense node SEN is Vsenon20 or Vsenoff20. Vsenon20 is a voltage of the sense node SEN when the selected memory cell MC is in an on-state in a time period t10 to t11. Vsenoff20 is a voltage of the sense node SEN when the selected memory cell MC is in an off-state in the time period t10 to t11.

Next, at t11, while the charge of the sense node SEN is held, the voltage of the signal CLKSA is reduced to be returned to the original voltage level. Accordingly, the voltage of the sense node SEN decreases, while the charge state of the sense node SEN is held. That is, as shown in FIG. 4, the voltage of the sense node SEN decreases from Vsenon20 to Vsenon21 or from Vsenoff20 to Vsenoff21. At this time, the charge state of the sense node SEN is held, and thus a voltage difference between Vsenon20 and Vsenoff20 is substantially equal to a voltage difference between Vsenon21 and Vsenoff21. That is, the voltage of the sense node SEN decreases by as much as a decrease amount in the voltage of the signal CLKSA, while the voltage difference between Vsenon20 and Vsenoff20 is held.

Next, in a time period t12 to t13, the signal STR rises in a pulse shape to cause the strobe transistor Tstr to be in an on-state for a short time. When the strobe transistor Tstr becomes an on-state, the bus LBUS is connected to the sense transistor Tsen. After being discharged in the first read operation Read1 (t7), the bus LBUS is precharged again before the second read operation Read2. Accordingly, when the sense transistor Tsen is in an off-state in the second read operation Read2, the bus LBUS is not discharged and the voltage of the bus LBUS is maintained at a high level. On the other hand, when the sense transistor Tsen is in an on-state, the bus LBUS is discharged and the voltage of the bus LBUS is reduced to a low level.

The voltage level of the bus LBUS at this time is latched by the second latch circuit L2. For example, it is assumed that the threshold voltage Vtsen is between Vsenon21 and Vsenoff21. When the voltage of the sense node SEN is Vsenon21, the sense transistor Tsen is in an off-state and thus the voltage of the bus LBUS does not decrease much. Accordingly, in this case, the second latch circuit L2 latches logical high. On the other hand, when the voltage of the sense node SEN is Vsenoff21, the sense transistor Tsen is in an on-state and thus the voltage of the bus LBUS decreases. Accordingly, in this case, the second latch circuit L2 latches logical low. As explained above, the second latch circuit L2 can latch a voltage state (a logic state) of the sense node SEN in the second read operation Read2.

In the time period t7 to t8 of shifting from the first read operation Read1 to the second read operation Read2, the charge state of the sense node SEN is maintained. Accordingly, discharge from the sense node SEN in the second read operation Read2 means further discharge from the sense node SEN that has been discharged in the first read operation Read1. That is, in the second read operation Read2, the sense node SEN is precharged at t1 and then discharged in a time period (T1+T2) where the first time period T1 is added to the second time period T2. As explained above, the discharge period of the sense node SEN in the first read operation Read1 is different from that in the second read operation Read2. In the first read operation Read1, the sense node SEN is discharged for the first time period T1. In the second read operation Read2, the sense node SEN is discharged in the time period (T1+T2). Therefore, logic of the sense node SEN in the first read operation Read1 depends on the first time period T1, and logic of the sense node SEN in the second read operation Read2 depends on the first and second time periods T1+T2.

Data (L1, L2) latched in the first latch circuit L1 and the second latch circuit L2 is one of (H, H), (L, H), and (L, L). H denotes logical high and L denotes logical low.

When the latched data (L1, L2) in the first latch circuit L1 and the second latch circuit L2 is (H, H), this indicates that the sense transistor Tsen does not become an on-state in the first and second read operations Read1 and Read2 and that the voltage of the sense node SEN is lower than the threshold voltage Vtsen of the sense transistor Tsen. This means that the threshold voltage of a selected memory cell MC is much lower than a target threshold and that the sense node SEN is discharged in a short time. Accordingly, in the next write operation, a voltage difference between the bit line BL and the word line WL is relatively increased, so that the threshold voltage of the selected memory cell MC is shifted relatively largely. That is, in the next write operation, data is written relatively intensively in the selected memory cell MC.

When the latched data (L1, L2) in the first latch circuit L1 and the second latch circuit L2 is (L, L), this indicates that the sense transistor Tsen becomes an on-state in the first and second read operations Read1 and Read2 and that the voltage of the sense node SEN is higher than the threshold voltage Vtsen of the sense transistor Tsen. This means that the threshold voltage of a selected memory cell MC is higher than a target threshold and that the sense node SEN is not discharged much for a long time (T1+T2). Therefore, it can be determined that data write has been completed in the selected memory cell MC. In this case, in the next write operation, the voltage difference between the bit line BL and the word line WL is substantially zero, so that the threshold voltage of the selected memory cell MC is not shifted. That is, in the next write operation, data is not written in the selected memory cell MC.

When the latched data (L1, L2) in the first latch circuit L1 and the second latch circuit L2 is (L, H), the sense transistor Tsen becomes an on-state in the first read operation Read1, but does not become an on-state in the second read operation Read2. This case indicates that the voltage of the sense node SEN is higher than the threshold voltage Vtsen of the sense transistor Tsen in the first read operation Read1 but is lower than that in the second read operation Read2. This means that the threshold voltage of a selected memory cell MC becomes closer to a target threshold, but does not reach the target threshold. Accordingly, this means that the sense node SEN is not discharged much in a short time such as T1, but is discharged when a time period such as T1+T2 elapses. Therefore, in the next write operation, the voltage difference between the bit line BL and the word line WL is relatively reduced, so that the threshold voltage of the selected memory cell MC is shifted by a relatively small amount (finely). That is, in the next write operation, data is written relatively less intensively in the selected memory cell MC.

In the next write operation, the voltage difference between the bit line BL and the word line WL is controlled by adjusting the voltage of the bit line BL. For example, when the latched data (L1, L2) in the first latch circuit L1 and the second latch circuit L2 is (H, H), the SD latch circuit SDL causes the flag node FLG to be logical high. The voltage of the node COM is thus set to the low-level voltage Vss. At this time, the clamp logic circuit CLC relatively increases the voltage of the signal BLC and reduces the resistance value of the clamp transistor Tblc. The voltage of the node COM is thus transmitted to the bit line BL at a low resistance and the voltage of the bit line BL becomes the low-level voltage Vss.

In a write operation, a selected word line WL rises to a write high-level voltage. The voltage difference between the bit line BL and the word line WL thus becomes large. As a result, the threshold voltage of a selected memory cell MC can be shifted largely and become further closer to a target threshold.

For example, when the latched data (L1, L2) in the first latch circuit L1 and the second latch circuit L2 is (L, H), the SD latch circuit SDL causes the flag node FLG to be logical low. The voltage of the node COM is thus set to the high-level voltage (Vbly-Vtbly). Vbly is a voltage that is much higher than the Vddsa. The voltage of the node COM thus becomes a voltage level substantially equal to the Vddsa. Meanwhile, to reduce the voltage difference between the bit line BL and the word line WL, the clamp logic circuit CLC relatively reduces the voltage of the signal BLC, and the clamp transistor Tblc clamps the voltage level of the bit line BL to be higher than the Vss. The voltage of the bit line BL thus becomes an intermediate voltage between the low-level voltage Vss and the high-level voltage (Vbly-Vtbly). The voltage difference between the bit line BL and the word line WL in a write operation becomes moderate. As a result, the threshold voltage of a selected memory cell MC can be shifted by a relatively small amount and finely, and become closer to a target threshold or be equal to or larger than the target threshold. Even when the threshold voltage of the selected memory cell MC is equal to or larger than the target threshold, a shift amount of the threshold voltage of the selected memory cell MC is small and thus the threshold voltage of the selected memory cell MC does not deviate significantly from the target threshold.

For example, when the latched data (L1, L2) in the first latch circuit L1 and the second latch circuit L2 is (L, L), the SD latch circuit SDL causes the flag node FLG to be logical low. The voltage of the node COM is thus set to the high-level voltage (Vbly-Vtbly). As explained above, the voltage of the node COM is a voltage level substantially equal to the Vddsa. Meanwhile, to cause the voltage difference between the bit line BL and the word line WL to be substantially zero, the clamp logic circuit CLC sufficiently increases the voltage of the signal BLC and sets the voltage of the bit line BL to the voltage of the node COM (Vddsa). A channel voltage of a selected memory cell MC is thus increased and a voltage difference between a channel of the selected memory cell MC and a selected word line WL becomes very small or substantially zero. As a result, the threshold voltage of the selected memory cell MC in which write has been completed is not shifted.

As explained above, the degree of data write in each selected memory cell MC can be changed in the next write operation according to write states of a plurality of selected memory cells MC.

To detect the write states of the selected memory cells MC, the memory according to the first embodiment performs the first and second read operations Read1 and Read2 in each verify read operation, as explained above.

Generally, each read operation performs both precharge and discharge of the sense node SEN. Therefore, when a verify read operation includes a plurality of read operations, in each read operation, the sense amplifier SA precharges the sense node SEN and then discharges the sense node SEN.

For example, it is assumed that the precharge period is denoted as Tprech and that the discharge periods of two read operations are denoted as T1 and T3, respectively. In this case, the total of a precharge period and a discharge period required to perform the two read operations is represented by 2×Tprech+T1+T3.

On the other hand, the memory according to the first embodiment does not perform a precharge operation of the sense node SEN between the first read operation Read1 and the second read operation Read2. That is, in the time period (t7 to t8 in FIG. 4) of shifting from the first read operation Read1 to the second read operation Read2, the charge state of the sense node SEN is maintained. Accordingly, after being precharged at t1, the sense node SEN is equivalent to a sense node SEN that is discharged in the time period (T1+T2) where the first time period T1 is added to the second time period T2.

For example, assuming that the precharge period is denoted as Tprech, the total of a precharge period and a discharge period required to perform the first and second read operations Read1 and Read2 is represented by Tprech+T1+T2.

As explained above, according to the first embodiment, the precharge operation of the sense node SEN is not performed between the first read operation Read1 and the second read operation Read2, so that the time period of a verify read operation is reduced by as much as the precharge period Tprech. As explained above, because the precharge transistor Thll is an N-type transistor, the precharge period Tprech is relatively long. Accordingly, when the precharge period Tprech is omitted, the time period of the verify read operation can be significantly reduced.

According to the first embodiment, in the second read operation Read2, the sense node SEN has been already discharged in the first time period T1 and thus it suffices that the second time period T2 is a short time. For example, the time period T3 mentioned above is a discharge time after performing precharge again. Therefore, to obtain a charge state that is the same as that of the sense node SEN after the second read operation Read2 according to the first embodiment, it is necessary to set the time period T3 to T1+T2. On the other hand, in the first embodiment, because the sense node SEN has been already discharged for the first time period T1, in the second read operation Read2, the second time period T2 can be shorter than the time period T3 by as much as the first time period T1. In the time period of a verify read operation according to the first embodiment, not only the precharge period but also the discharge period (T2) in the second read operation Read2 can be reduced. Accordingly, it is permissible that the second time period T2 is set to be shorter than the first time period T1.

As a result, the memory according to the first embodiment can write the threshold voltage of a selected memory cell MC in a narrow area by QPW, and reduce the time period of the verify read operation.

Furthermore, the verify read operation according to the first embodiment can be performed in not only the configuration of the sense amplifier circuit SA shown in FIG. 3 but also in other sense amplifier circuits SA.

While each verify read operation includes two read operations Read1 and Read2 in the first embodiment, each verify read operation can include three or more read operations. In this case, after performing precharge before a first read operation, a sense amplifier SA does not perform precharge between the read operations and can maintain a charge state of the sense node SEN.

Second Embodiment

Figure 5:
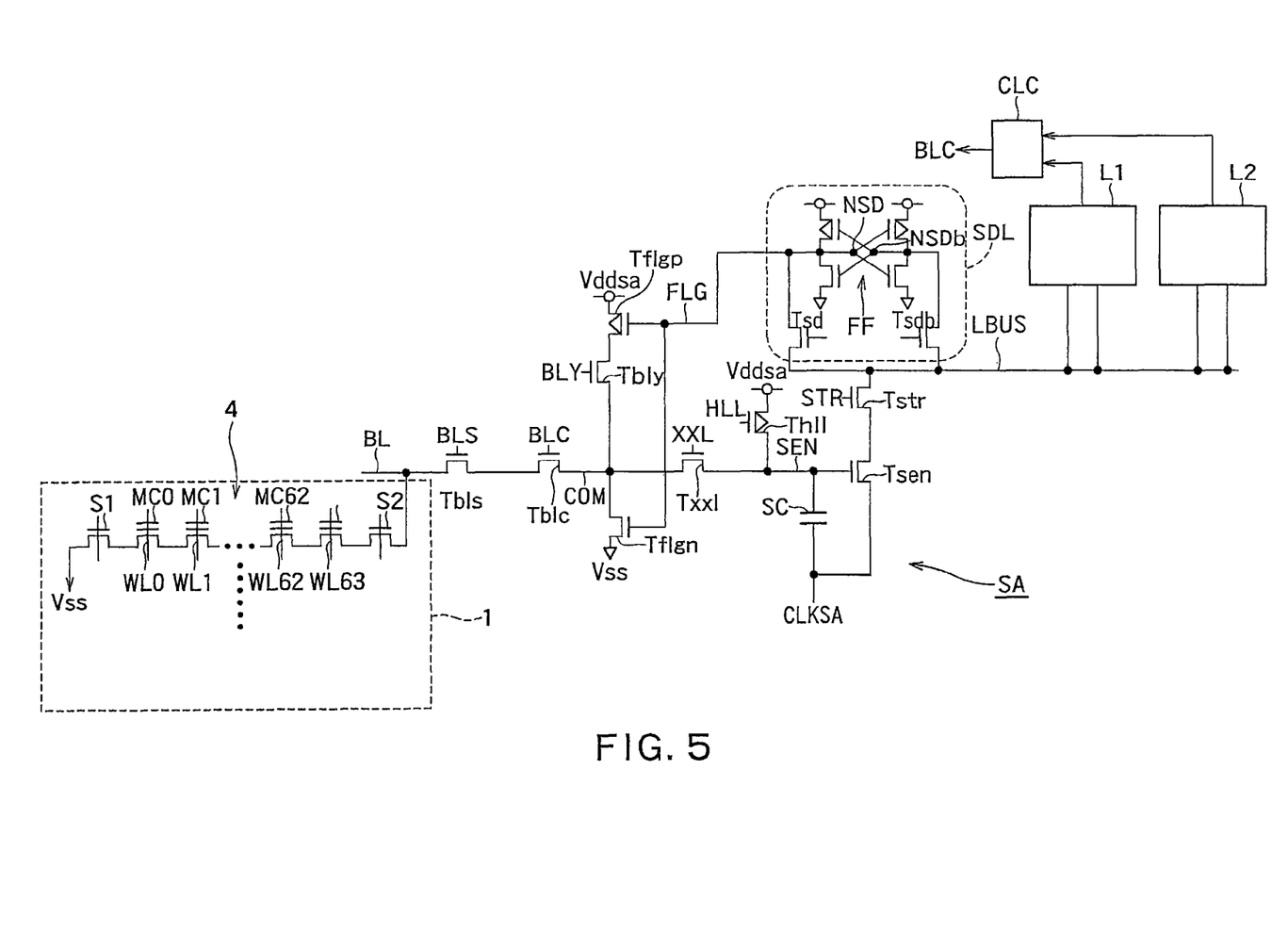
FIG. 5 shows an example of a configuration of a sense amplifier circuit SA according to a second embodiment.

FIG. 5 shows an example of a configuration of a sense amplifier circuit SA according to a second embodiment. In the second embodiment, the select gate transistor S1 on the side of a source of the NAND cell unit 4 is connected to the low-level voltage Vss and in correspondence thereto, the precharge transistor Thl1 is constituted by a P-type transistor. Other configurations of the second embodiment can be identical to corresponding configurations according to the first embodiment.

In a case where the select gate transistor S1 on the side of the source of the NAND cell unit 4 is connected to the cell source CELSRC as in the first embodiment, when the signal CLKSA rises in time periods t2 to t5 and t8 to t11 shown in FIG. 4, the voltage of the cell source CELSRC is higher than the Vss and thus the voltage of the sense node SEN may exceed the power supply voltage Vddsa. In this case, when the precharge transistor Thl1 is constituted by a P-type transistor, a substrate current flows from the sense node SEN. Therefore, in the first embodiment, the precharge transistor Thl1 is constituted by an N-type transistor. When the precharge transistor Thl1 is constituted by a P-type transistor, a regulator (not shown) is required to change the power supply voltage Vddsa.

On the other hand, as in the second embodiment, when the select gate transistor S1 on the side of the source of the NAND cell unit 4 is connected to the low-level voltage Vss, even when the signal CLKSA rises, the voltage of the sense node SEN does not exceed the power supply voltage Vddsa. Accordingly, the precharge transistor Thl1 can be constituted by a P-type transistor. In this case, the signal HLL reduces the voltage level, thereby causing the precharge transistor Thl1 to be in an on-state. The logic of the signal HLL in the second embodiment is thus opposite to that in the first embodiment. Other operations of the second embodiment can be identical to those according to the first embodiment. Thus, the second embodiment can attain identical effects as those according to the first embodiment.

Furthermore, because the current drive capability of a P-type transistor is higher than that of an N-type transistor, in the second embodiment, a precharge period (Tprech) can be reduced.

Further, in the second embodiment, an end of the sense capacitor SC and a source of the sense transistor Tsen can be connected to the low-level voltage Vss instead of the signal CLKSA. In this case, the low-level voltage Vss does not rise like the signal CLKSA, and thus an operation of a memory is identical to that shown in FIG. 7.

Third Embodiment

Figure 6:
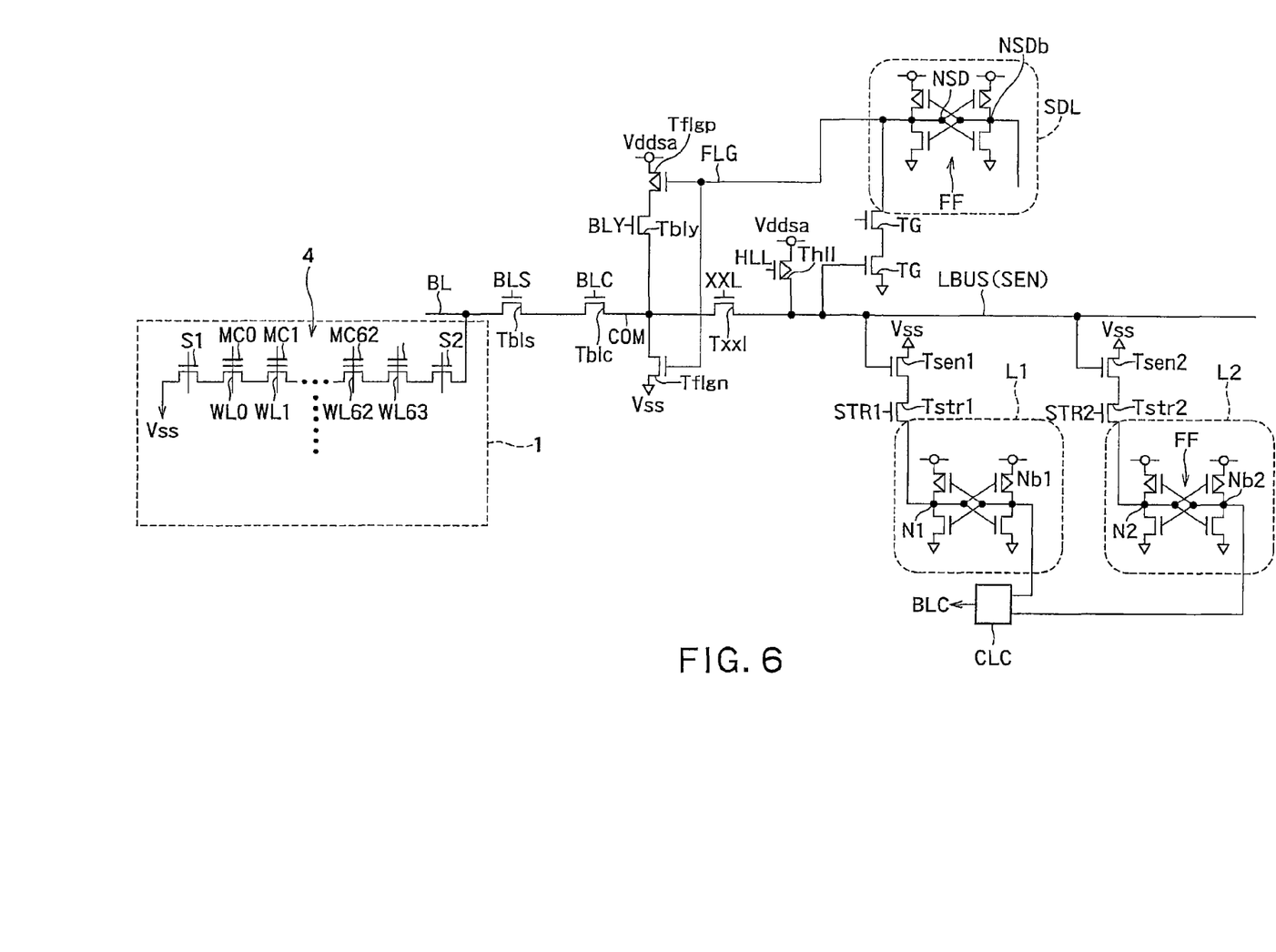
FIG. 6 shows an example of a configuration of a sense amplifier circuit SA according to a third embodiment.

FIG. 6 shows an example of a configuration of a sense amplifier circuit SA according to a third embodiment. In the third embodiment, the sense node SEN and the bus LBUS are common to each other and the sense capacitor SC is not connected to the sense node SEN. Accordingly, the sense amplifier circuit SA detects a threshold voltage of a selected memory cell MC by using the wiring capacity of the bus LBUS (that is, by using the bus LBUS as the sense node SEN). The bus LBUS and the sense node SEN are hereinafter referred to as a sense node LBUS(SEN). The switching transistor Txxl is connected between the node COM and the sense node LBUS(SEN).

The sense amplifier circuit SA includes the SD latch circuit SDL, the first latch circuit L1, the second latch circuit L2, a first sense transistor Tsen1, a second sense transistor Tseng, a first strobe transistor Tstr1, a second strobe transistor Tstr2, and a transfer gate TG.

The SD latch circuit SDL has the flip flop FF similarly to the first embodiment, and the node NSD is connected to the flag node FLG. The node NSD is connected via the transfer gate TG to the sense node LBUS(SEN).

Internal configurations of the first and second latch circuits L1 and L2 are identical to that of the SD latch circuit SDL. A node N1 of one end of a flip flop FF in the first latch circuit L1 is connected via the first strobe transistor Tstr1 and the first sense transistor Tsen1 to the low-level voltage Vss. A strobe signal. STR1 is input to a gate of the first strobe transistor Tstr1. The first strobe transistor Tstr1 is connected between the first sense transistor Tsen1 and the first latch circuit L1. A gate of the first sense transistor Tsen1 is directly connected to the sense node LBUS(SEN). A node Nb1 of the other end of the flip flop FF in the first latch circuit L1 is connected to the clamp logic circuit CLC.

Similarly, a node N2 of one end of a flip flop FF in the second latch circuit L2 is connected via the second strobe transistor Tstr2 and the second sense transistor Tsen2 to the low-level voltage Vss. A strobe signal STR2 is input to a gate of the second strobe transistor Tstr2. The second strobe transistor Tstr2 is connected between the second sense transistor Tsen2 and the second latch circuit L2. A gate of the second sense transistor Tsen2 is directly connected to the sense node LBUS(SEN).

The first latch circuit L1 latches logic of the sense node LBUS(SEN) in the first read operation Read1. The second latch circuit L2 latches logic of the sense node LBUS(SEN) in the second read operation Read2. Other configurations of the third embodiment can be identical to corresponding configurations according to the first or second embodiment. In the sense amplifier circuit SA shown in FIG. 6, the precharge transistor Thl1 is constituted by a P-type transistor, and thus a signal HLL according to the third embodiment is operated similarly to that of the second embodiment.

Figure 7:
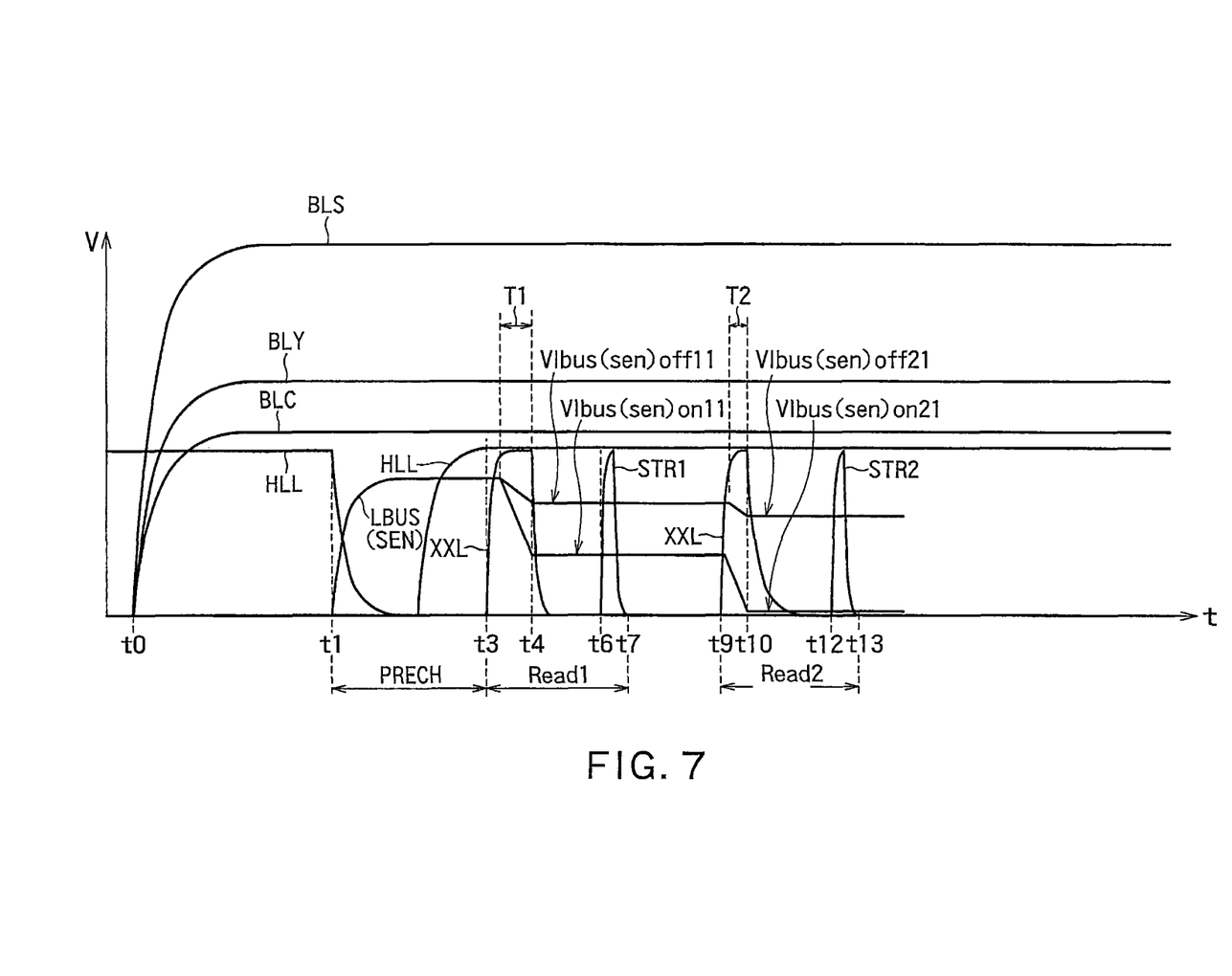
FIG. 7 is a timing chart of an example of an operation of a memory according to the third embodiment.

FIG. 7 is a timing chart of an example of an operation of a memory according to the third embodiment.

At t0, signals BLS, BLY, and BLC rise similarly to those of the first embodiment. Because the precharge transistor Thl1 is a P-type transistor, the signal HLL is maintained at logical high at t0.

Next, at t1, the voltage of the signal HLL falls to cause the precharge transistor Thl1 to be in an on-state. The sense node LBUS(SEN) is thus precharged. After precharge is completed, the voltage of the signal HLL rises again.

(First Read Operation)

After precharge is completed, at t3, the signal XXL rises to cause the switching transistor Txxl to be in an on-state. The voltage of the sense node LBUS(SEN) thus becomes a voltage according to the threshold voltage of the memory cell MC.

After the first time period T1 elapses since the signal XXL rises, at t4, the signal XXL falls. That is, in the first read operation Read1, discharge from the sense node LBUS (SEN) to a bit line BL and a selected memory cell MC is performed during the first time period T1, and then the switching transistor Txxl becomes an off-state. The sense node LBUS(SEN) becomes a floating state, and thus the charge of the sense node LBUS(SEN) is held. At this time, the voltage of the sense node LBUS(SEN) becomes Vlbus (sen)on11 or Vlbus(sen)off11. Vlbus(sen)on11 is a voltage of the sense node LBUS(SEN) when the selected memory cell MC is in an on-state in a time period t4 to t7. Vlbus (sen)off11 is a voltage of the sense node LBUS(SEN) when the selected memory cell MC is in an off-state at the time period t4 to t7.

Next, in a time period t6 to t7, a signal STR1 rises in a pulse shape to cause the strobe transistor Tstr1 to be in an on-state for a short time. The voltage level of the sense node LBUS(SEN) is thus latched by the first latch circuit L1. As explained above, the first latch circuit L1 can latch a voltage state (a logic state) of the sense node LBUS(SEN) in the first read operation Read1.

(Second Read Operation)

After the first read operation Read1, the second read operation Read2 is successively performed. In the third embodiment, the signal HLL does not fall between the first read operation Read1 and the second read operation Read2 and a precharge operation of the sense node SEN is not performed. That is, in a time period t7 to t9 of shifting from the first read operation Read1 to the second read operation Read2, the charge state of the sense node SEN is maintained. Accordingly, in the time period t7 to t9, the voltage of the sense node LBUS(SEN) is maintained at a level equal to that of the sense node LBUS(SEN) in a time period t4 to t6 in the first read operation Read1.

Next, at t9, the signal XXL rises to cause the switching transistor Txxl to be in an on-state. The voltage of the sense node LBUS(SEN) thus becomes a further reduced voltage according to the threshold voltage of the memory cell MC.

After the second time period T2 elapses since the signal XXL rises, at t10, the signal XXL falls. That is, in the second read operation Read2, discharge from the sense node LBUS (SEN) to the bit line BL and the selected memory cell MC is performed during the second time period T2, and then the switching transistor Txxl becomes an off-state. As a result, the sense node LBUS(SEN) becomes a floating state again, and thus the charge of the sense node LBUS(SEN) is held. At this time, the voltage of the sense node LBUS(SEN) becomes Vlbus(sen)on21 or Vlbus(sen)off21. Vlbus(sen) on21 is a voltage of the sense node LBUS(SEN) when the selected memory cell MC is in an on-state in a time period t10 to t13. Vlbus(sen)off21 is a voltage of the sense node LBUS(SEN) when the selected memory cell MC is in an off-state.

Next, in a time period t12 to t13, a signal STR2 rises in a pulse shape to cause the strobe transistor Tstr2 to be in an on-state for a short time. The voltage level of the sense node LBUS(SEN) is thus latched by the second latch circuit L2. As explained above, the second latch circuit L2 can latch a voltage state (a logic state) of the sense node LBUS(SEN) in the second read operation Read2.

Similarly, in a sense amplifier circuit SA according to the third embodiment, in the time period t7 to t9 of shifting from the first read operation Read1 to the second read operation Read2, the charge state of the sense node SEN is maintained. Therefore, discharge from the sense node LBUS(SEN) in the second read operation Read2 means further discharge from the sense node LBUS(SEN) that has been discharged in the first read operation Read1. That is, in the second read operation Read2, the sense node LBUS(SEN) is precharged at t1 and then discharged in a time period (T1+T2) where the first time period T1 is added to the second time period T2. As explained above, the discharge period of the sense node LBUS(SEN) in the first read operation Read1 is different from that in the second read operation Read2. In the first read operation Read1, the sense node LBUS(SEN) is discharged for the first time period T1. In the second read operation Read2, the sense node LBUS(SEN) is discharged in the time period (T1+T2). Therefore, logic of the sense node LBUS(SEN) in the first read operation Read1 depends on the first time period T1, and logic of the sense node LBUS(SEN) in the second read operation Read2 depends on the first and second time periods T1+T2.

Data (L1, L2) latched in the first latch circuit L1 and the second latch circuit L2 is one of (H, H), (L, H), and (L, L).

Subsequent write operations are the same as those explained in the first embodiment. Accordingly, the memory according to the third embodiment can also change the degree of data write in each selected memory cell MC in the next write operation according to write states of a plurality of selected memory cells MC.

According to the third embodiment, a precharge operation of the sense node LBUS(SEN) is not performed between the first read operation Read1 and the second read operation Read2. In the second read operation Read2, the sense node LBUS(SEN) is further discharged from a state of having been already discharged for the first time period T1. Accordingly, the third embodiment can attain identical effects as those according to the first or second embodiment.

When the select gate transistor S1 on the side of a source of the NAND cell unit 4 is connected to the cell source CELSRC, the precharge transistor Thll is preferably constituted by an N-type transistor. In this case, the third embodiment operates similarly to the first embodiment. That is, the third embodiment can be applied to the first embodiment.

In the embodiments described above, the first latch circuit L1 latches a detection result of the first read operation and the second latch circuit L2 latches a detection result of the second read operation. However, for example, there is a case where after a detection result of the first read operation is stored in the first latch circuit L1, data based on this detection result (data obtained by calculating the detection result) is stored in the second latch circuit L2 or other latch circuits. In this case, a detection result of the second read operation can be stored again in the first latch circuit L1. In this case, the detection results of the first and second read operations are temporarily stored in the same latch circuit L1, and thus variation in the resistance of write in a latch circuit and the like does not need to be considered. Therefore, even when the detection results of the first and second read operations are stored in the same latch circuit, effects of the embodiments described above are not lost.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a memory cell array comprising a plurality of memory cells;
a plurality of word lines connected to control gates of the memory cells;
a bit line electrically connectable to the memory cells; and
a sense node transmitting logic of data stored in the memory cell selected by the word line and the bit line, wherein
a verify read operation in a data program sequence comprises a first read operation and a second read operation,
in a time period of shifting from the first read operation to the second read operation, a charge state of the sense node is maintained, and
the sense node is not precharged between the first read operation and the second read operation.

2. The device of claim 1 further comprising a first latch circuit and a second latch circuit configured to latch logic transmitted to the sense node, wherein
in the first read operation, discharge from the sense node to the memory cell is performed during a first time period and the first latch circuit latches logic of the sense node, and
in the second read operation subsequent to the first read operation, discharge from the sense node to the memory cell is performed during a second time period and the first or second latch circuit latches logic of the sense node.

3. The device of claim 2, wherein the second time period is shorter than the first time period.

4. The device of claim 3, wherein
logic of the sense node in the first read operation depends on the first time period, and
logic of the sense node in the second read operation depends on the first and second time periods.

5. The device of claim 3, further comprising:
a first sense transistor having a gate connected to the sense node;
a first strobe transistor connected between the first sense transistor and the first latch circuit;
a second sense transistor having a gate connected to the sense node; and
a second strobe transistor connected between the second sense transistor and the second latch circuit.

6. The device of claim 2, wherein
logic of the sense node in the first read operation depends on the first time period, and
logic of the sense node in the second read operation depends on the first and second time periods.

7. The device of claim 6, wherein in the verify read operation, the first read operation and the second read operation are successively performed.

8. The device of claim 6, further comprising:
a first sense transistor having a gate connected to the sense node;
a first strobe transistor connected between the first sense transistor and the first latch circuit;
a second sense transistor having a gate connected to the sense node; and
a second strobe transistor connected between the second sense transistor and the second latch circuit.

9. The device of claim 2, further comprising:
a precharge transistor connected between the sense node and a power supply; and
a clamp transistor that is connected between the bit line and the sense node and becomes a conductive state according to data latched in the first and second latch circuits.

10. The device of claim 2, further comprising:
a sense capacitor connected to the sense node; and
a sense transistor having a gate connected to the sense node, the sense transistor having one end connected to the first and second latch circuits, and providing a current according to logic of the sense node.

11. The device of claim 1, wherein in the verify read operation, the first read operation and the second read operation are successively performed.

12. The device of claim 2, wherein in the verify read operation, the first read operation and the second read operation are successively performed.

13. The device of claim 2, further comprising:
a first sense transistor having a gate connected to the sense node;
a first strobe transistor connected between the first sense transistor and the first latch circuit;
a second sense transistor having a gate connected to the sense node; and
a second strobe transistor connected between the second sense transistor and the second latch circuit.

14. The device of claim 2, wherein
in the first read operation, the first latch circuit latches logic of the sense node, and
in the second read operation subsequent to the first read operation, the second latch circuit latches logic of the sense node.

15. The device of claim 2, wherein
in the first read operation, the first latch circuit latches logic of the sense node and the second latch circuit latches data based on data latched in the first latch circuit, and
in the second read operation subsequent to the first read operation, the first latch circuit latches logic of the sense node.

* * * * *